United States Patent
Lee et al.

(10) Patent No.: US 10,050,089 B2
(45) Date of Patent: Aug. 14, 2018

(54) ORGANIC LIGHT-EMITTING DISPLAY PANEL

(71) Applicant: LG Display Co., Ltd., Seoul (KR)

(72) Inventors: Heui-Dong Lee, Paju-si (KR); Sang-Gun Lee, Uijeongbu-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/794,241

(22) Filed: Oct. 26, 2017

(65) Prior Publication Data
US 2018/0151631 A1    May 31, 2018

(30) Foreign Application Priority Data
Nov. 30, 2016   (KR) .................. 10-2016-0162318

(51) Int. Cl.
    *H01L 51/52*    (2006.01)
    *H01L 27/32*    (2006.01)
    *H01L 51/50*    (2006.01)

(52) U.S. Cl.
    CPC ........ *H01L 27/3211* (2013.01); *H01L 27/322* (2013.01); *H01L 51/5004* (2013.01); *H01L 51/5064* (2013.01); *H01L 51/5072* (2013.01); *H01L 51/5088* (2013.01); *H01L 51/52* (2013.01); *H01L 51/5253* (2013.01); *H01L 2251/552* (2013.01)

(58) Field of Classification Search
    CPC .............................. H01L 51/5253; H01L 51/52
    USPC ......................................................... 257/98
    See application file for complete search history.

(56) References Cited

U.S. PATENT DOCUMENTS

| | | | |
|---|---|---|---|
| 9,917,201 B2* | 3/2018 | Sakakura | H01L 29/78645 |
| 2012/0068202 A1* | 3/2012 | Saito | G02F 1/1368 |
| | | | 257/88 |
| 2014/0217372 A1 | 8/2014 | Shim et al. | |
| 2016/0155978 A1 | 6/2016 | Park | |
| 2017/0301889 A1* | 10/2017 | Hayashida | H01L 51/56 |
| 2018/0033841 A1* | 2/2018 | Yang | H01L 27/3246 |
| 2018/0061904 A1* | 3/2018 | Shim | H01L 27/3206 |
| 2018/0062106 A1* | 3/2018 | Heo | H01L 21/02008 |

OTHER PUBLICATIONS

Zhi-Qiang et al., "Improved performance of organic light-emitting diodes with dual electron transporting layers," Chinese Physics B, 21: 67202 (2012).
Extended European Search Report issued in counterpart European Patent Application No. 17183485.6 dated Feb. 3, 2018.

* cited by examiner

*Primary Examiner* — George Fourson, III
(74) *Attorney, Agent, or Firm* — Morgan, Lewis & Bockius LLP

(57) ABSTRACT

An organic light-emitting display panel may prevent current leakage to an adjacent sub-pixel through a common layer having high hole mobility via the arrangement of an auxiliary pattern. The organic light-emitting display panel includes a bank provided in a non-emission portion so as to overlap an edge of a first electrode, a first common layer located on the first electrode in an emission portion and the bank in the non-emission portion, and an auxiliary pattern in contact with the first common layer on the bank.

19 Claims, 12 Drawing Sheets

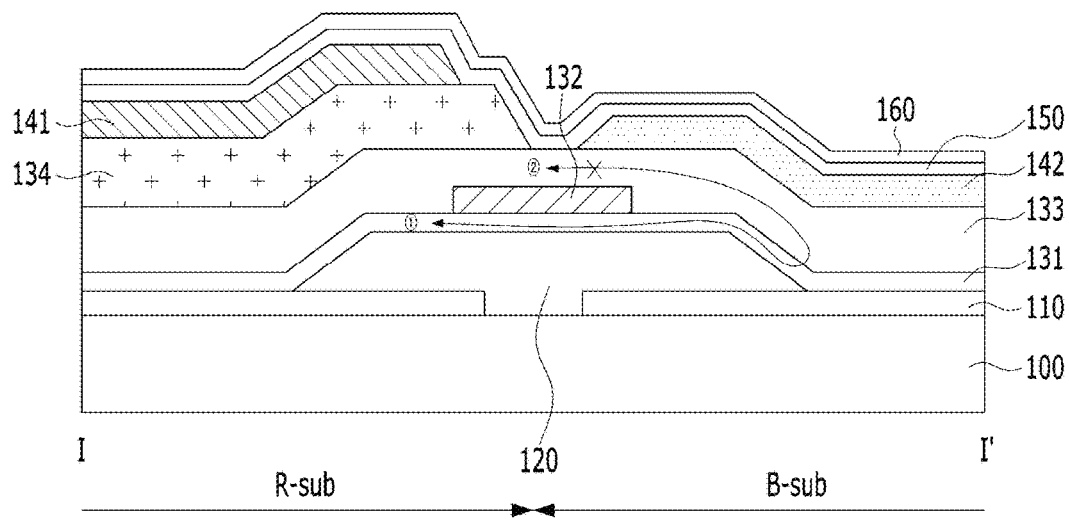

EMISSION PORTION

ORGANIC LIGHT-EMITTING DISPLAY PANEL

This application claims the benefit of Korean Patent Application No. 10-2016-0162318, filed on Nov. 30, 2016, which is hereby incorporated by reference as if fully set forth herein.

BACKGROUND

Technical Field

The present invention relates to an organic light-emitting element, and more particularly, to an organic light-emitting display panel that prevents current leakage to an adjacent sub-pixel through a common layer having high hole mobility via the arrangement of an auxiliary pattern.

Discussion of the Related Art

Recently, as the information age has fully arrived, the field of displays that visually display electrically conveyed information signals has developed rapidly. In response to this, various kinds of flat panel display devices having excellent characteristics, such as a small thickness, a low weight, and low power consumption, have been developed and have rapidly replaced existing cathode ray tubes (CRTs).

Representative examples of such flat panel display devices may include a liquid crystal display (LCD) device, a plasma display panel (PDP) device, a field emission display (FED) device, and an organic light-emitting display (OLED) device.

Among these, the organic light-emitting display device is considered a competitive application because it does not require a separate light source and enables realization of a compact device design and vivid color display.

The organic light-emitting display device includes organic light-emitting elements, which are independently driven on a per-sub-pixel basis. Such an organic light-emitting element includes an anode, a cathode, and a plurality of organic layers between the anode and the cathode.

The organic layers include a hole injection layer, a hole transport layer, an organic light-emitting layer, and an electron transport layer, which are sequentially disposed from the anode side. Among these, the organic light-emitting layer substantially functions to emit light as the energy of excitons, produced via the combination of holes and electrons, falls down to the ground state. The other layers function to assist in the transport of holes or electrons to the organic light-emitting layer.

In addition, in the organic light-emitting display device, for color display, sub-pixels are divided into red, green, and blue sub-pixels, and on a per-sub-pixel basis, an organic light-emitting layer having the color of a corresponding sub-pixel is formed. Generally, deposition using a shadow mask is used to form the organic light-emitting layer.

When the shadow mask has a large area, the shadow mask may droop due to the weight thereof, and thus may cause deterioration in a yield rate when used multiple times. Therefore, the other organic layers excluding the light-emitting layer are continuously formed in common in the respective sub-pixels without the shadow mask.

However, since current may flow laterally through the resulting common layer of the sub-pixels that is continuously formed in a plane, lateral current leakage may occur.

FIG. 1 is a photograph illustrating low-gradation blue illumination of a conventional organic light-emitting display panel.

FIG. 1 illustrates the illuminated state of the conventional organic light-emitting display panel upon blue illumination at 15 grayscale, that is, upon low-gradation blue illumination.

As illustrated in FIG. 1, in the conventional organic light-emitting display panel, upon low-gradation blue illumination, a phenomenon in which an adjacent red sub-pixel is also turned on occurs. This represents a phenomenon in which current, which flows through a vertical electric field between an anode and a cathode of a blue sub-pixel, which is turned on, leaks laterally through a common layer, causing an adjacent sub-pixel to be turned on. The lateral current leakage, in particular, mainly occurs in a low-gradation display, as in FIG. 1. This is because, when current, which horizontally flows in the blue sub-pixel, flows laterally to common organic layers, the adjacent red sub-pixel, which is in an off state, acts as if it were turned on.

This is because the drive voltage required for red illumination is lower than the drive voltage required for blue illumination, and therefore, even a small amount of leaked current causes illumination similar to blue illumination.

In particular, such other color illumination caused by lateral current leakage may cause color mixing in a low-gradation display, which may prevent a desired color from being normally displayed.

In addition, the lateral current leakage may have a greater effect on the adjacent sub-pixel when the hole mobility of the common organic layer is increased.

SUMMARY

Accordingly, the present invention is directed to an organic light-emitting display panel that substantially obviates one or more problems due to limitations and disadvantages of the related art.

An object of the present invention is to provide an organic light-emitting display panel, which prevents current leakage to an adjacent sub-pixel through a common layer having high hole mobility. According to various embodiments of the present invention, the object may be achieved via the arrangement of an auxiliary pattern.

Another object of the present invention is to provide an organic light-emitting display panel that may prevent electrical leakage by providing a pattern for the division of sub-pixels on a highly conductive common layer.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an organic light-emitting display panel comprises a substrate including a plurality of sub-pixels each having an emission portion and a non-emission portion, a first electrode to cover at least the emission portion of each sub-pixel, a bank provided in the non-emission portion so as to overlap an edge of the first electrode, a first common layer located on the first electrode in the emission portion and the bank in the non-emission portion, an auxiliary pattern in contact with the first common layer on the bank, a second common layer provided on the auxiliary pattern and the first common layer, and a light-emitting layer disposed on the second common layer in each sub-pixel.

The auxiliary pattern may include or may be formed of an organic material. For example, the organic material may be an electron transport material. The electron transport material may be a material having electron mobility that is at least two times as great as hole mobility of the electron transport material. The auxiliary pattern, e.g. the electron transport material of the auxiliary pattern, may have a higher electron mobility than the first common layer (e.g., a material or the material of the first common layer).

The auxiliary pattern may have a HOMO energy level that is lower than a highest occupied molecular orbital (HOMO) energy level of the first common layer by a value within a range from 0.4 eV to 0.8 eV.

In addition, the second common layer may include a hole transport material, and the second common layer may have a lowest unoccupied molecular orbital (LUMO) energy level and a HOMO energy level that are respectively higher than a LUMO energy level and the HOMO energy level of the auxiliary pattern.

The second common layer may include a plurality of layers formed of different hole transport materials respectively.

The first common layer may include a hole injection material as a host and a p-type dopant.

In addition, the auxiliary pattern may be provided in a stripe along the sub-pixels in a column.

The auxiliary pattern may receive a voltage applied on opposite ends thereof.

In addition, the auxiliary pattern may be provided in an island form in a single sub-pixel or a plurality of sub-pixels.

Meanwhile, the sub-pixels of the substrate may include a red sub-pixel, a green sub-pixel, and a blue sub-pixel, the light-emitting layer provided in the red sub-pixel may be a red light-emitting layer, the light-emitting layer provided in the green sub-pixel may be a green light-emitting layer, and the light-emitting layer provided in the blue sub-pixel may be a blue light-emitting layer.

In addition, the auxiliary pattern may be provided only around the emission portion of the red sub-pixel.

The blue light-emitting layer may be in contact with the second common layer.

The organic light-emitting display panel may further include a first auxiliary hole transport layer between the second common layer and the red light-emitting layer in the red sub-pixel.

The organic light-emitting display panel may further include a second auxiliary hole transport layer between the second common layer and the green light-emitting layer in the green sub-pixel. In this case, the first auxiliary hole transport layer may be thicker than the second auxiliary hole transport layer.

Meanwhile, the organic light-emitting display panel may further include a third common layer and a second electrode to cover the red light-emitting layer, the green light-emitting layer, and the blue light-emitting layer. In this case, the organic light-emitting display panel may further include an electron injection layer between the second electrode and the third common layer.

The auxiliary pattern and the third common layer may be formed of an electron transport material.

Here, the sub-pixels of the substrate may include a red sub-pixel, a green sub-pixel, and a blue sub-pixel, the light-emitting layer of each sub-pixel may be a white light-emitting layer, and a red color filter layer in the red sub-pixel, a green color filter layer in the green sub-pixel, and a blue color-filter layer in the blue sub-pixel is further provided.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principles of the invention.

FIG. 3 is a cross-sectional view taken along line I-I' of FIG. 2.

FIGS. 4A and 4B are schematic cross-sectional views of a non-emission portion and an emission portion.

DETAILED DESCRIPTION

Figure 1:
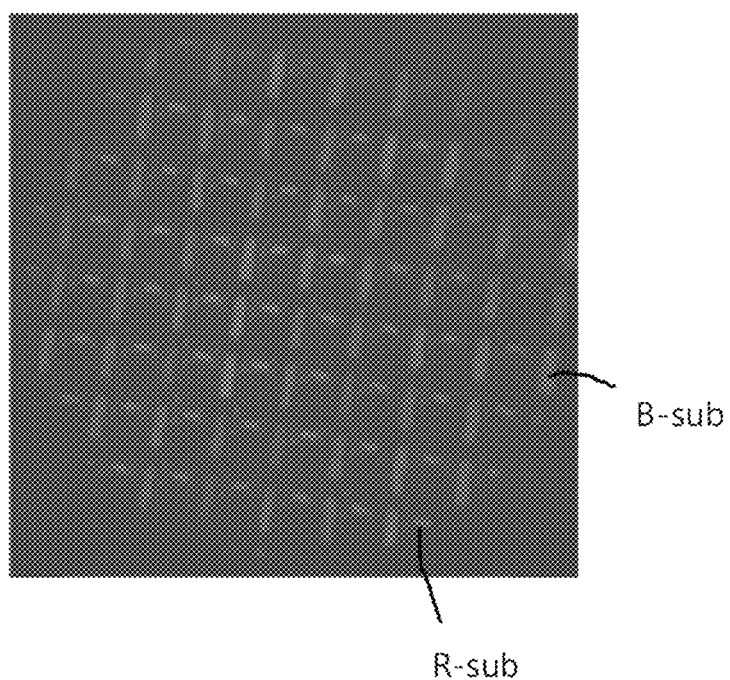
FIG. 1 is a photograph illustrating low-gradation blue illumination of a conventional organic light-emitting display panel.

The advantages and features of the present invention and the way of attaining them will become apparent with reference to embodiments described below in detail in conjunction with the accompanying drawings. The present invention, however, are not limited to the embodiments disclosed hereinafter and may be embodied in many different forms. Rather, these exemplary embodiments are provided so that this disclosure will be through and complete and will fully convey the scope to those skilled in the art. The scope of the present invention should be defined by the claims.

In the drawings for explaining the exemplary embodiments of the present invention, for example, the illustrated shape, size, ratio, angle, and number are given by way of example, and thus, are not limited to the disclosure of the present invention. Throughout the present specification, the same reference numerals designate the same constituent elements. In addition, in the following description of the present invention, a detailed description of known functions and configurations incorporated herein will be omitted when it may make the subject matter of the present invention rather unclear. The terms "comprises," "includes," and/or "has", used in this specification, do not preclude the presence or addition of other elements unless it is used along with the term "only". The singular forms "a," "an," and "the" are intended to include the plural forms as well, unless the context clearly indicates otherwise.

In the interpretation of constituent elements included in the various embodiments of the present invention, the constituent elements are interpreted as including an error range even if there is no explicit description thereof.

In the description of the various embodiments of the present invention, when describing positional relationships, for example, when the positional relationship between two parts is described using "on", "above", "below", "aside", or the like, one or more other parts may be located between the two parts unless the term "directly" or "closely" is used. The term "in contact" as used herein may be understood to mean "in direct mechanical contact", in other words "having a common interface".

In the description of the various embodiments of the present invention, when describing temporal relationships, for example, when the temporal relationship between two actions is described using "after", "subsequently", "next", "before", or the like, the actions may not occur in succession unless the term "directly" or "just" is used.

In the description of the various embodiments of the present invention, although terms such as, for example, "first" and "second" may be used to describe various elements, these terms are merely used to distinguish the same or similar elements from each other. Therefore, in the present specification, an element modified by "first" may be the same as an element modified by "second" within the technical scope of the present invention unless otherwise mentioned.

The respective features of the various embodiments of the present invention may be partially or wholly coupled to and combined with each other, and various technical linkage and driving thereof are possible. These various embodiments may be performed independently of each other, or may be performed in association with each other.

In this specification, the "lowest unoccupied molecular orbital (LUMO) energy level" and the "highest occupied molecular orbital (HOMO) energy level" of any layer mean the LUMO energy level and the HOMO energy level of a material that occupies the greatest weight percentage of the corresponding layer, for example, a host material, and does not refer to the LUMO energy level and the HOMO energy level of a dopant material doped on the corresponding layer unless otherwise mentioned.

In this specification, the "HOMO energy level" may be the energy level measured by cyclic voltammetry (CV) that determines the energy level from a potential value relative to a reference electrode, the potential value of which is known. For example, the HOMO energy level of any material may be measured using ferrocene, the oxidation potential value and the reduction potential value of which are known, as a reference electrode.

In this specification, the term "doped" means that the material that occupies the greatest weight percentage of any layer is added with a material that has a different physical property (for example, an N-type or P-type or an organic material or an inorganic material) from that of the material that occupies the greatest weight percentage, in an amount corresponding to a weight percentage less than 10%. In other words, a "doped" layer means a layer, the host material and the dopant material of which may be distinguished from each other based on the weight percentages thereof. In addition, the term "undoped" refers to all cases excluding the case corresponding to the term "doped". For example, when any layer is formed of a single material or is formed of a mixture of materials having the same or similar properties, the layer belongs to the "undoped" layer. For example, when at least one constituent material of any layer is of a P-type and all other constituent materials of the layer are not of an N-type, the layer belongs to the "undoped" layer. For example, when at least one constituent material of any layer is an organic material and all other constituent materials of the layer are not an inorganic material, the layer belongs to the "undoped" layer. For example, when any layer is mainly formed of organic materials, at least one material of the layer is of an N-type and at least one other material of the layer is of a P-type, the layer belongs to the "doped" layer when the weight percentage of the N-type material is less than 10% or the weight percentage of the P-type material is less than 10%.

In this specification, an electroluminescence (EL) spectrum is calculated by multiplying (1) a photoluminescence (PL) spectrum that reflects the unique properties of a luminescent material, such as a dopant material or a host material included in an organic light-emitting layer, by (2) an out-coupling spectral emittance curve that is determined based on the structure of an organic light-emitting element including the thicknesses of organic layers such as, for example, an electron transport layer, and optical properties thereof.

In this specification, a stack means a unit structure that includes organic layers such as a hole transport layer and an electron transport layer and an organic light-emitting layer interposed between the hole transport layer and the electron transport layer. The organic layers may further include a hole injection layer, an electron blocking layer, a hole blocking layer, and an electron injection layer, and may further include other organic layers according to the structure or design of the organic light-emitting element.

Figure 2:
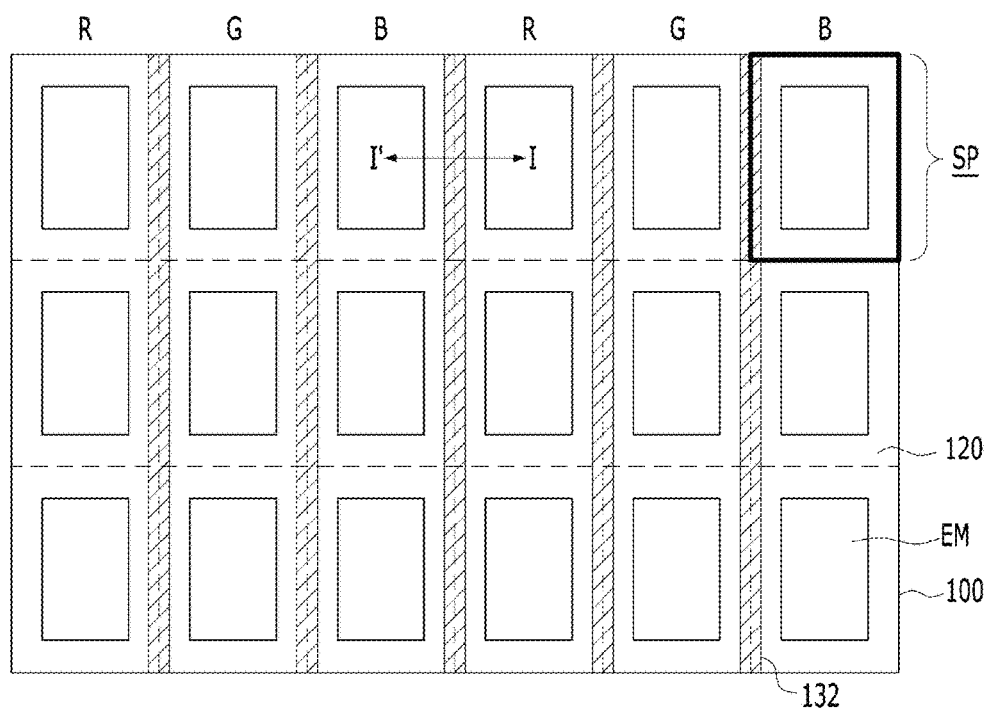
FIG. 2 is a plan view illustrating an organic light-emitting display panel of the present invention.

FIG. 2 is a plan view illustrating an organic light-emitting display panel of the present invention, and FIG. 3 is a cross-sectional view taken along line I-I' of FIG. 2.

As illustrated in FIGS. 2 and 3, the organic light-emitting display panel includes a substrate 100 having a plurality of sub-pixels SP each having an emission portion and a non-emission portion, a first electrode 110 configured to cover at least the emission portion (EM) of each sub-pixel SP, a bank 120 provided in the non-emission portion so as to overlap the edge of the first electrode 110, a first common layer 131 disposed on the first electrode 110 in the emission portion and the bank 120 in the non-emission portion, an auxiliary pattern 132 in contact with the first common layer 131 above the bank 120, a second common layer 133 provided on the first common layer 131 including the auxiliary pattern 132, and light-emitting layers 141 and 142 disposed on the second common layer 133 in the respective sub-pixels SP.

Each sub-pixel SP illustrated in FIG. 2 shows that the non-emission portion is located around the emission portion (EM). In FIG. 2, the non-emission portion corresponds to the region where the bank 120 is positioned. Although the emission portion may be located at the center of each sub-pixel SP, the present invention is not limited thereto, and the emission portion may be located close to a part of the boundary of the sub-pixel SP. However, the emission portion is formed in a part of each sub-pixel SP, rather than being formed in the entire sub-pixel SP, and the periphery of the emission portion is defined as the non-emission portion. The reason why the emission portion is formed in a part of the sub-pixel SP is to prevent color mixing between adjacent sub-pixels SP, or is attributable to process limitation. The entire area of the sub-pixel SP is not used as the emission portion, but only a part thereof is defined as the emission portion, and the emission portion is defined in the area in which the bank 120 is open. Recently, several attempts have been made to expand the emission portion. However, the non-emission portion around the emission portion is necessarily provided, although the area thereof may vary for division between sub-pixels SP, and the auxiliary pattern 132 of the present invention is provided at the boundary of adjacent sub-pixels SP (e.g., adjacent sub-pixels of different colors, e.g. subpixels R-sub and B-sub shown in FIG. 3) in the non-emission portion. Meanwhile, the non-emission portion is defined in the area in which the bank 120 is provided, and the auxiliary pattern 132 is disposed at the upper side of the bank 120.

In the organic light-emitting display panel of the present invention, the common layers are continuously formed in a plane without distinction between the sub-pixels and are formed without using a deposition mask. In other words, the common layers may cover all sub-pixels or the common layer may cover a group of sub-pixels.

Among these, the first common layer 131 is formed by mixing an organic material having a hole transport property with a p-type dopant having higher hole mobility than that of other organic layers, wherein the other organic layers include the auxiliary pattern 132, the second common layer 133 (which may function as hole transport layer), first and second auxiliary hole transport layers 134 and 135 (which will be described herein below), and a third common layer 150 (which will also be described herein below). That is, the first common layer 131 (which may function as hole injection layer) has the highest hole mobility among the organic layers of the organic light-emitting display panel. Here, since holes receive great barriers at the interface of the first electrode 110 and the organic layer, the p-type dopant is included to reduce the barriers upon hole injection and facilitate smooth hole injection. The hole transport organic material, which is the host material of the first common layer 131, may have a HOMO energy level having an absolute value similar to the work function of the first electrode 110. Here, the p-type dopant may be a p-type organic dopant or inorganic dopant. The p-type organic dopant may be one or more selected from the group consisting of compounds of the following chemical formulas 1 to 4, hexadecafluorophthalocyanine (F16CuPc), 11,11,12,12-tetracyanonaphtho-2,6-quinodimethane (TNAP), 3,6-difluoro-2,5,7,7,8,8-hexacyano-quinodimethane (F2-HCNG), and tetracyanoquinodimethane (TCNQ).

Chemical Formula 1

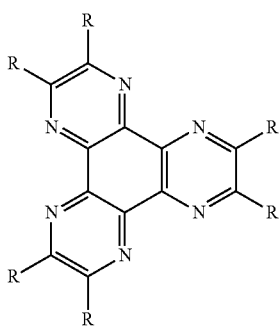

In Chemical Formula 1, R is a cyano group, sulfone group, sulfoxide group, sulfonamide group, sulfonate group, nitro group, or trifluoromethyl group.

Chemical Formula 2

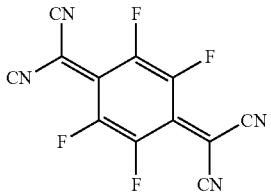

Chemical Formula 3

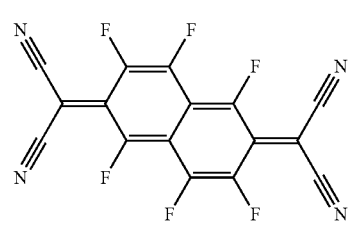

Chemical Formula 4

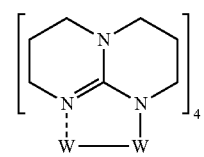

In addition, in another example, when the p-type dopant is an inorganic dopant, it may be one or more selected from the group consisting of metal oxides and metal halides. Specifically, the p-type inorganic dopant may be one or more selected from the group consisting of $MoO_3$, $V_2O_5$, $WO_3$, $SnO_2$, $ZnO$, $MnO_2$, $CoO_2$, $ReO_3$, $TiO_2$, $FeCl_3$, $SbCl_5$, and $MgF_2$.

The auxiliary pattern 132 serves to disconnect the flow of current that is horizontally transferred in the formation area thereof. On the first common layer 131 having high hole transport ability, the auxiliary pattern 132 is formed using an opposite electron transport property, thereby preventing the transfer of holes on the first common layer 131. With this arrangement of the auxiliary pattern 132, lateral current leakage is prevented. Thereby, when a drive voltage is applied only to a particular sub-pixel, the auxiliary pattern 132 serves to prevent current from leaking to an adjacent sub-pixel. To this end, the auxiliary pattern 132 may be provided at the boundary of adjacent sub-pixels. As illustrated in FIG. 3, since the auxiliary pattern 132 is located at the boundary of adjacent sub-pixels in the area above the first common layer 131 having high hole transport ability, even if some current horizontally flows in the first common layer 131 (see the path ①) below the auxiliary pattern 132, the auxiliary pattern 132 prevents current leakage in the common layers of adjacent sub-pixels thereabove (see the path ②). During actual driving, unwanted illumination substantially does not occur by current that is horizontally transferred in the common layers, but occurs when the horizontally transferred current is vertically transferred to the light-emitting layer of the sub-pixel that is not driven (e.g., light-emitting layer 141 of the sub-pixel R-sub in FIG. 3). Therefore, in the organic light-emitting display panel of the present invention, the auxiliary pattern 132 is provided at the boundary of adjacent sub-pixels in order to block the vertical current path in the sub-pixel that is not driven (e.g., sub-pixel R-sub in FIG. 3).

Meanwhile, the first common layer 131 having high hole mobility is provided closest to the first electrode 110, and the second common layer 133 is provided to cover the auxiliary pattern 132.

The second common layer 133 has a hole transport property, and functions to transfer holes from the first common layer 131 having a hole injection property to the light-emitting layers 141 and 142 located thereabove. The effective height of each light-emitting layer, within which light of a corresponding color may be emitted between the first electrode 110 and a second electrode 160, is determined according to the resonance condition of a light-emitting material included in the light-emitting layer. In order to adjust this height, a first auxiliary hole transport layer 134 is provided.

In a red sub-pixel, which emits longer-wavelength light than other sub-pixels, a red light-emitting layer 141 needs to be located farthest from the first electrode 110. In a blue sub-pixel, which emits light having the shortest wavelength in a visible light range, a blue light-emitting layer 142 needs to be located closest to the first electrode 110. Therefore, in order to locate the red light-emitting layer 141 higher than the blue light-emitting layer 142, the first auxiliary hole transport layer 134 is provided between the red light-emitting layer 141 and the second common layer 133. That is, the first auxiliary hole transport layer 134 has a hole transport property and is formed only in the red sub-pixel. In some cases, an auxiliary hole transport layer may be provided in another sub-pixel, for example, in a green sub-pixel. In this case, the auxiliary hole transport layer provided in the green sub-pixel may be located at a different position than the first auxiliary hole transport layer 134 for the red light-emitting layer 141, and may have a different (e.g., smaller) thickness than the first auxiliary hole transport layer 134. In addition, the light-emitting layer 141 or 142 of each sub-pixel may be provided in the area that includes at least the emission portion of the sub-pixel, and as illustrated, may expand to the peripheral non-emission portion. In this case, since no auxiliary hole transport layer is provided in the blue sub-pixel, the blue light-emitting layer 142 may be in direct contact with the second common layer 133.

In addition, a third common layer 150, which has an electron transport property, and the second electrode 160 are formed in common in the sub-pixels so as to cover the light-emitting layers 141 and 142.

Hereinafter, the current path in the vertical cross-section will be described with reference to the vertical cross sections of the area in which the auxiliary pattern is provided and the emission portion of the sub-pixel.

Figure 4B:
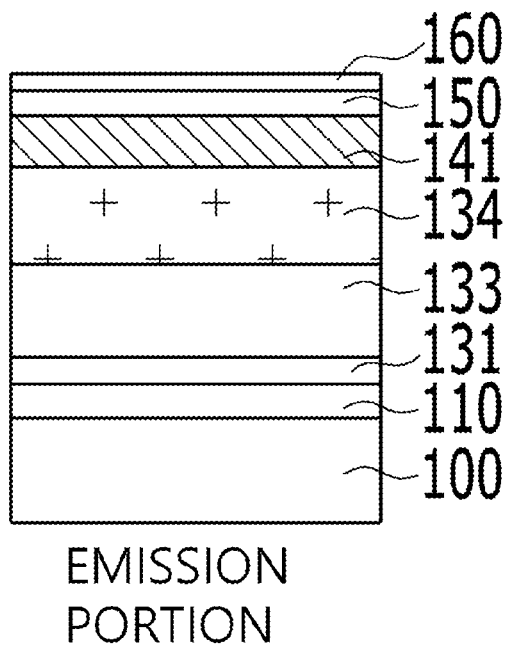

FIGS. 4A and 4B are schematic cross-sectional views of the non-emission portion (between the sub-pixels R-sub and B-sub in FIG. 3) and the emission portion (of the sub-pixel R-sub).

As illustrated in FIG. 4A, when viewing the vertical cross section of the area of the non-emission portion in which the auxiliary pattern 132 is provided, the substrate 100, the bank 120, the first common layer 131, the auxiliary pattern 132, the second common layer 133, the third common layer 150, and the second electrode 160 are provided in this sequence. As illustrated in FIG. 4B, the emission portion of the red sub-pixel R-sub includes the substrate 100, the first electrode 110, the first common layer 131, the second common layer 133, the first auxiliary hole transport layer 134, the red light-emitting layer 141, the third common layer 150, and the second electrode 160 provided in this sequence.

Here, the auxiliary pattern 132, which is provided in the non-emission portion of FIG. 4A, is formed of an electron transport material, unlike the first and second common layers 131 and 133 having a hole transport property so as to increase barriers between the first common layer 131 and the second common layer 133, thereby blocking upwardly transferred vertical current. Accordingly, in the emission portion of the red sub-pixel in FIG. 4B, so long as no drive voltage is applied to the first electrode 110 (of the red sub-pixel R-sub) and the second electrode 160, no current is horizontally transferred above the first common layer 131, and thus no light is emitted from the red light-emitting layer 141.

Here, the aforementioned electron transport material means a material having electron mobility that is at least two times as great as hole mobility of the electron transport material. Thus, when the auxiliary pattern 132 is an interlayer between the first and second common layers 131 and 132 having a hole transport property, the auxiliary pattern 132 may prevent holes, transferred upward from the first common layer 131, from being supplied to the second common layer 133. That is, the auxiliary pattern 132 intercepts the vertical current that is transferred thereto in the non-emission portion, which is the boundary of the blue sub-pixel, and also intercepts the horizontal current that is transferred to the layers including the second common layer 133 above the auxiliary pattern 132 in other sub-pixels excluding the sub-pixel to which the drive voltage is applied.

On the other hand, when a voltage is applied to the first and second electrodes 110 and 160 in another sub-pixel, for example, in a blue sub-pixel, holes introduced into the first and second electrodes 110 and 160 through the first common layer 131 and the second common layer 133 and electrons introduced into the first and second electrodes 110 and 160 through the third common layer 150 recombine with each other in the blue light-emitting layer 142 to produce excitons. Light is emitted when the energy of the excitons falls down to the ground state.

Figure 5:
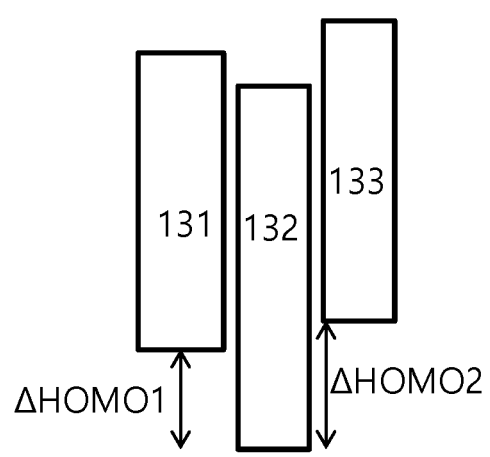
FIG. 5 is a view illustrating the band gap characteristics of peripheral layers of an auxiliary pattern.

FIG. 5 is a view illustrating the band gap characteristics of peripheral layers of the auxiliary pattern.

As illustrated in FIG. 5, the auxiliary pattern 132 is formed of an electron transport material, and the HOMO energy level thereof is lower than that of the adjacent first and second common layers 131 and 133 by an amount within the range from 0.4 eV to 0.8 eV. That is, the difference ($\Delta$HOMO1, $\Delta$HOMO2) of the HOMO energy level between the auxiliary pattern 132 and adjacent layers 131 or 133 is 0.4 eV to 0.8 eV. Here, the magnitude of the HOMO energy level is determined based on the negative value itself. When comparing the absolute value, the absolute value of the HOMO energy level of the auxiliary pattern 132 is higher than the HOMO energy level of the adjacent first and second common layers 131 and 133.

The auxiliary pattern 132 may be provided in contact with the first common layer 131 having the highest hole mobility. In some cases, in addition to the second common layer 133, a single hole transport layer or a plurality of hole transport layers may be further provided above the auxiliary pattern 132. The additional hole transport layer(s) may be an auxiliary hole transport layer that is selectively provided only in a corresponding sub-pixel, or may be a common layer. In any case, the auxiliary pattern 132 prevents holes from being vertically transferred upward from the first common layer 131 to the hole transport layers.

In addition, the second common layer 133 includes a hole transport material. The second common layer 133 has a higher LUMO energy level and HOMO energy level than the LUMO energy level and HOMO energy level of the auxiliary pattern 132. The reason why the second common layer 133 has a high LUMO energy level is to prevent the invasion of electrons or excitons from an adjacent light-emitting layer. In addition, the reason why the second common layer 133 has a high HOMO energy level is because the HOMO energy level of a hole transport material is higher than the HOMO energy level of an electron transport material.

The first common layer 131, which assists in the injection of holes, may be provided in multiple layers so that the lower side thereof has a hole injection function and the upper side thereof has a hole transport function. The second common layer 133 may serve not only as a hole transport layer, but also as an electron or exciton blocking layer.

The second common layer 133 may be formed in multiple layers using different hole transport materials respectively.

Hereinafter, the organic light-emitting display panel of the present invention including different colors of sub-pixels will be described in detail.

Figure 6:
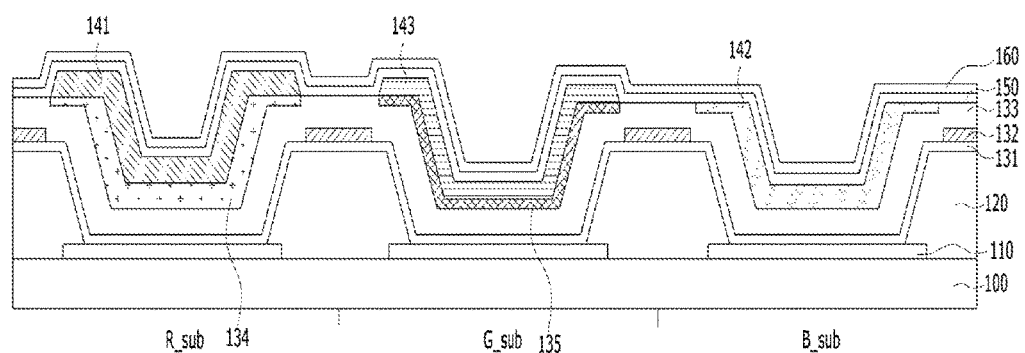
FIG. 6 is a cross-sectional view illustrating an organic light-emitting display panel according to a first embodiment of the present invention.

FIG. 6 is a cross-sectional view illustrating an organic light-emitting display panel according to a first embodiment of the present invention.

As illustrated in FIG. 6, the organic light-emitting display panel according to the first embodiment of the present invention has a configuration in which red, green, and blue sub-pixels R_sub, G_sub, B_sub are formed in sequence from the left side. With the exception that the red sub-pixel R_sub and the green sub-pixel G_sub respectively include the first auxiliary hole transport layer 134 and a second auxiliary hole transport layer 135 in order to set light-emitting positions suitable for resonance conditions, the respective sub-pixels have the same configuration of the emission portion in which the first electrode 110, the first common layer 131, the second common layer 133, the first auxiliary hole transport layer 134 or the second auxiliary hole transport layer 135 (which is omitted in the blue sub-pixel B_sub), the light-emitting layers 141, 143 and 142, the third common layer 150, and the second electrode 160 are formed on the substrate 100 in this sequence.

The non-emission portion is configured such that the bank 120, the first common layer 131, the auxiliary pattern 132, the second common layer 133, the third common layer 150, and the second electrode 160 are formed on the substrate 100 in this sequence.

Here, an electron injection layer (not illustrated) may be further formed on the surface at which the second electrode 160 and the third common layer 150 face each other. The electron injection layer may be formed of, for example, an inorganic material including an alkali metal or an alkali earth metal such as, for example, LiF, Li$_2$O, Li, Ca, Mg or Sm, and may be formed in the same process as the process of forming the second electrode 160.

The auxiliary pattern 132 may be disposed only above the bank 120 so as not to block the path of vertical current in the emission portion. The auxiliary pattern 132 may have a given thickness or less, for example, a thickness of 50 Å or less (in other words, greater than 0 and less than or equal to 50 Å), because the auxiliary pattern 132 may have an effect on the normal vertical current path in the emission portion when it is excessively thick. That is, the width and thickness of the auxiliary pattern 132 may be controlled so as to block the path of lateral leakage current in a particular area and to have no effect on vertical current in the emission portion depending on the application of a drive voltage between the first and second electrodes.

Meanwhile, the first common layer 131 may have a thickness within a range from approximately 40 Å to 160 Å, and serves to assist in the injection of holes from the first electrode 110. In some cases, the first common layer 131 may be formed in multiple layers such that one layer thereof, which is in contact with the first electrode 110, may assist in the injection of holes and the layer thereabove may assist in the transport of holes. In this case, the layer for the injection of holes may have a small thickness less than 100 Å (in other words, greater than 0 and less than 100 Å), and the layer for the transport of holes may have a thickness within the range from 500 Å to 1500 Å.

The second common layer 133, the first and second auxiliary hole transport layers 134 and 135, the light-emitting layers 141, 143 and 142, and the third common layer 150, which are provided above the auxiliary pattern 132, may have a greater thickness than that of the auxiliary pattern 132, for example a thickness within a range from approximately 100 Å to 1500 Å.

In some cases, the second common layer 133 may be formed in multiple layers using different hole transport materials. Among these layers, the layer, which is in contact with the light-emitting layer 142, may have a small thickness of 50 Å.

Meanwhile, the auxiliary pattern 132 may be formed of the same electron transport material as the third common layer 150.

Figure 7:
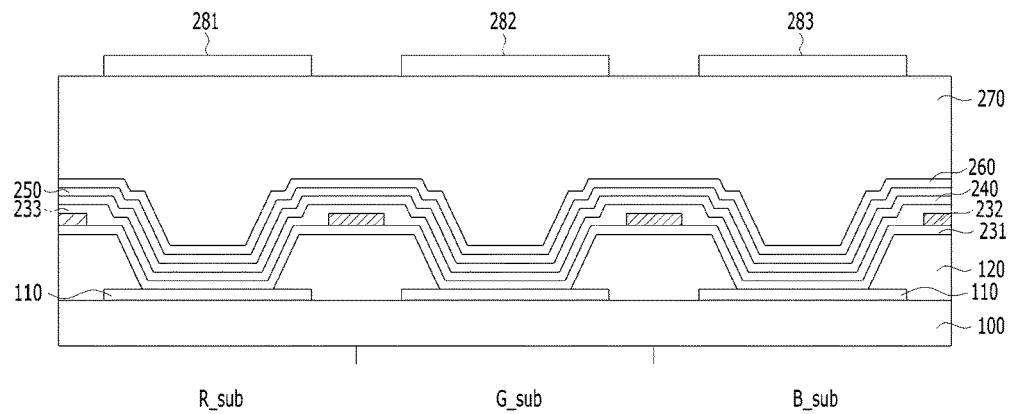
FIG. 7 is a cross-sectional view illustrating an organic light-emitting display panel according to a second embodiment of the present invention.

FIG. 7 is a cross-sectional view illustrating an organic light-emitting display panel according to a second embodiment of the present invention.

As illustrated in FIG. 7, the organic light-emitting display panel according to the second embodiment of the present invention includes a common white light-emitting layer 240 in respective sub-pixels, and the other layers excluding the first electrode 110 and an auxiliary pattern 232 are formed in common in the respective sub-pixels. In this case, a flattening layer 270 is provided on a second electrode 260 and serves to protect organic light-emitting diodes provided in the respective sub-pixels and to flatten the surface, and color filter layers 281, 282 and 283 are provided on the flattening layer 270 and serve to transmit light of a corresponding color for each sub-pixel.

The emission portion of each sub-pixel is configured such that the first electrode 110, a first common layer 231, a second common layer 233, the light-emitting layer 240, a third common layer 250, and the second electrode 260 are formed on the substrate 100 in this sequence.

The light-emitting layer 240 may be a single white light-emitting layer that emits white light, or may take the form of a stack including multiple light-emitting layers, a charge production layer between adjacent light-emitting layers, and a common layer between each light-emitting layer and an adjacent charge production layer. In the organic light-emitting display panel of the second embodiment, the light-emitting layer 240 may be formed in all sub-pixels without distinction between the sub-pixels and may be formed without using a deposition mask, and the distinction of colors of the respective sub-pixels may be realized by the color filter layers 281, 282 and 283. In some cases, the color filter layers 281, 282 and 283 may be formed on a separate opposite substrate (not illustrated), rather than being formed on the flattening layer 270.

The non-emission portion of each sub-pixel is configured such that the bank 120, the first common layer 231, the auxiliary pattern 232, the second common layer 233, the third common layer 250, and the second electrode 260 are formed on the substrate 100 in this sequence.

Even in the configuration of the second embodiment in which the light-emitting layer 240 is a common layer, since the sub-pixels are individually driven, the auxiliary pattern 232 defines the boundary of a sub-pixel that is driven and an adjacent sub-pixel that is not driven, thereby preventing lateral current leakage from the driven sub-pixel to the adjacent sub-pixel.

Hereinafter, the range in which the auxiliary pattern 132 or 232 is formed will be described.

Figure 8:
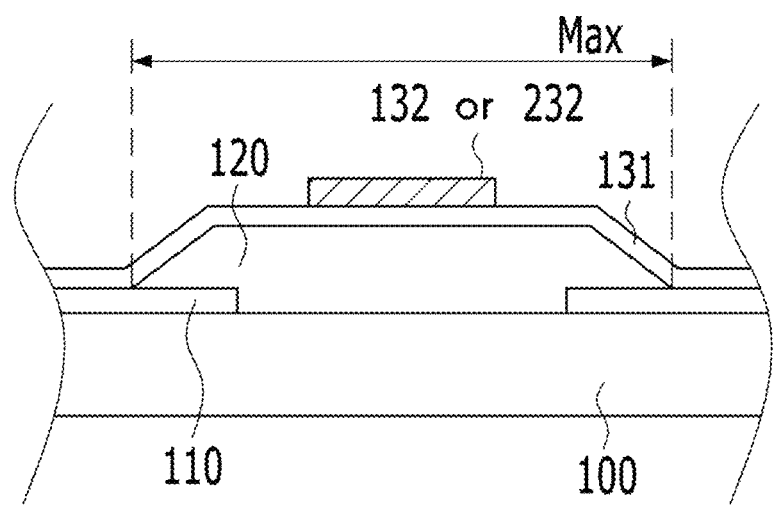
FIG. 8 is a cross-sectional view illustrating the range within which the auxiliary pattern may be formed.

FIG. 8 is a cross-sectional view illustrating the range within which the auxiliary pattern may be formed.

As illustrated in FIG. 8, the auxiliary pattern 132 or 232 may be formed inside the non-emission portion in which the bank 120 is formed, and may be formed in the entire non-emission portion when having the maximum width. For example, when the auxiliary pattern 132 or 232 has the maximum width, the auxiliary pattern 132 or 232 may be formed not only on a flat portion of the bank 120, but also on some or all of an inclined portion of the bank 120. In addition, the auxiliary pattern 132 or 232 needs to have at least a width required for the function thereof, and the width of the auxiliary pattern 132 may be ⅒ or more of the width of the flat portion of the bank 120.

The auxiliary pattern 132 or 232 may be formed only at the boundary of sub-pixels SP, which have the largest drive voltage, among the sub-pixels of different colors, or may be formed at each boundary of the sub-pixels SP. For example, the auxiliary pattern 132 or 232 may be formed only at the boundary of a red sub-pixel and a blue sub-pixel, which greatly suffer from current leakage, or may be formed at all boundaries of adjacent sub-pixels in order to prevent current leakage between adjacent sub-pixels.

Figure 9A:
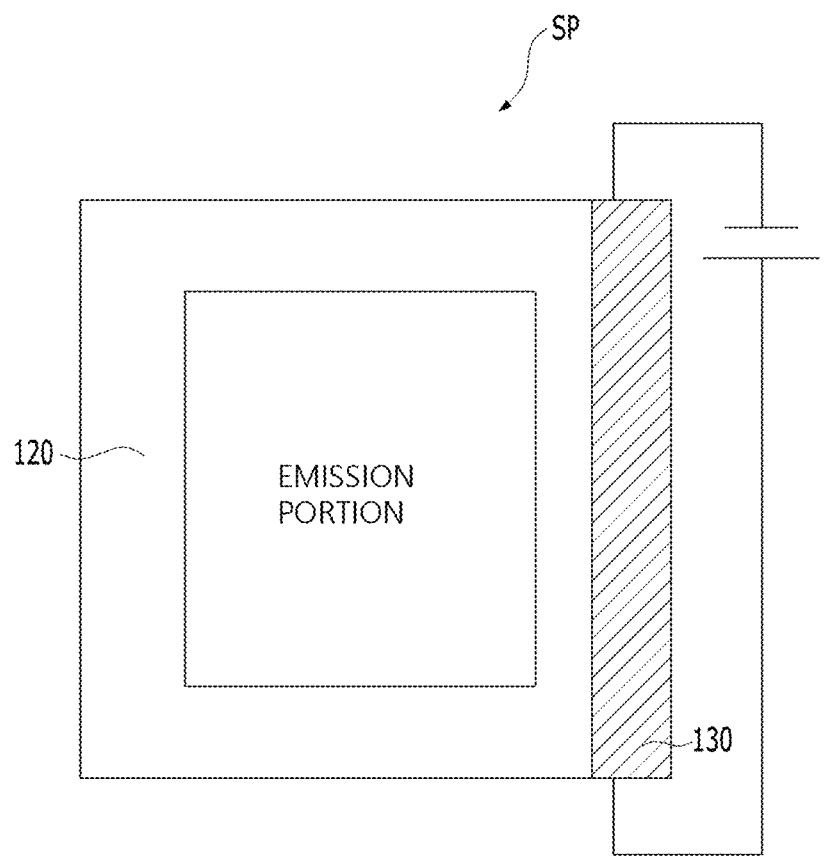
FIGS. 9A and 9B are plan views illustrating different application examples of the auxiliary pattern of the present invention.
Figure 9B:
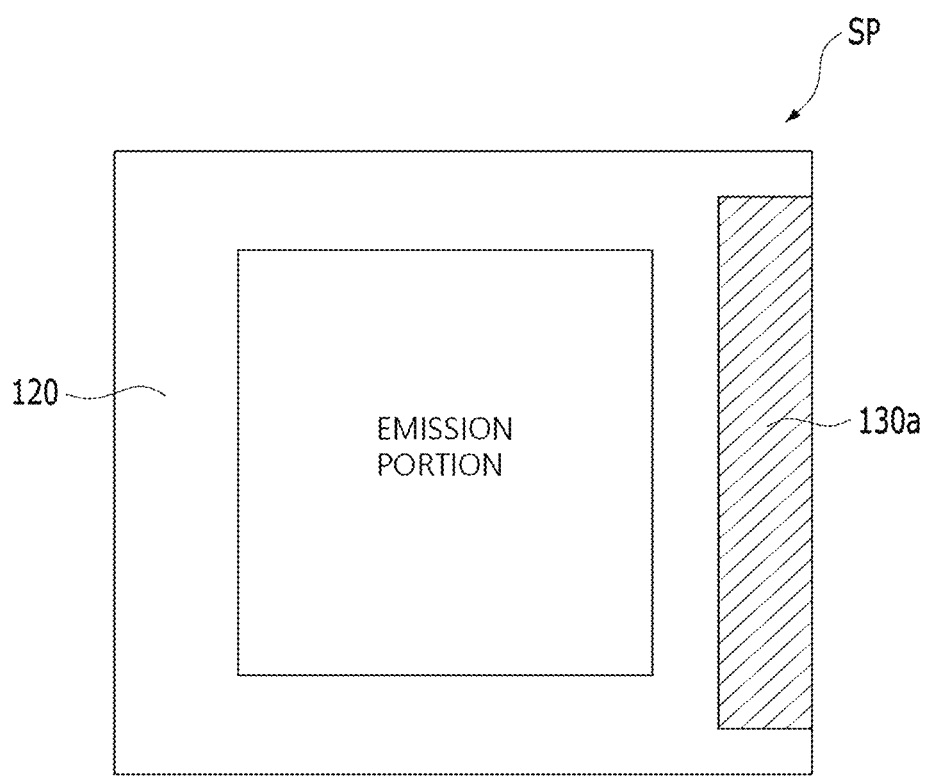

FIGS. 9A and 9B are plan views illustrating different application examples of the auxiliary pattern of the present invention.

As illustrated in FIG. 9A, in one example, an auxiliary pattern 130 may be formed along one side of the non-emission portion in each sub-pixel SP, and consequently, may be formed in a long line (stripe) shape along the respective sub-pixels SP in the column direction. As such, the auxiliary pattern 130 may prevent current leakage when a voltage is applied to opposite ends thereof. In this case, since the auxiliary pattern 130 is an organic pattern formed of an electron transport material, the auxiliary pattern 130 does not function as an electric wire even if a voltage is applied thereto, but functions as a ground pattern so as to block the path of vertically transferred current in the formation area thereof.

Meanwhile, although a voltage may be applied to opposite ends of the auxiliary pattern 130 as described above, the present invention is not limited thereto. As illustrated in FIG. 9B, an auxiliary pattern 130a may be separately patterned in each sub-pixel SP so as to have an island shape. In addition, the auxiliary pattern 130a may be formed at each boundary of two neighboring sub-pixels SP, or may be formed at the boundary of each unit including two or more sub-pixels SP so that the auxiliary patterns 130a of the respective units may be spaced apart from each other. In this case, each auxiliary pattern 130a may be in a floating state in which no voltage is applied thereto.

Both FIG. 9A and FIG. 9B illustrate that the auxiliary pattern 130 or 130a having an electron transport property is provided in contact with the first common layer 131 having a hole transport property in order to prevent current leakage.

Hereinafter, the drive voltage, the luminous efficacy and the lifespan will be described with regard to a comparative example and an example of the present invention, and the effect of the organic light-emitting display panel of the present invention will be described based on the degree of leakage current.

In all of the comparative example and the example, experimentation was performed on a blue sub-pixel. At this time, as illustrated in FIG. 3, in common, the emission portion of the blue sub-pixel includes, formed sequentially on the substrate, the first electrode 110 formed of an indium tin oxide (ITO), the first common layer 131 formed of a hole transport organic matter of any one of an arylene group, an aryl group, and a hetero group and a p-type dopant, the second common layer 133 formed of a hole transport organic matter of any one of an arylene group, an aryl group, and a hetero group, the second common layer 133 having a higher LUMO energy level than that of the first common layer 131, the blue light-emitting layer 142, the third common layer 150 formed of an electron transport material, and the second electrode 160 formed of a metal alloy such as, for example, Mg:Ag or Ca:Ag. The first common layer 131 includes double layers having thicknesses of 100 Å and 1100 Å, the second common layer 133 has a thickness of 50 Å, the blue light-emitting layer 142 has a thickness of 200 Å, the third common layer 150 has a thickness of 300 Å, and the second electrode 160 has a thickness of 200 Å.

In addition, the non-emission portions of the comparative example and the example are the same as each other except that, in the non-emission portion of the example, the auxiliary pattern 132 is further formed to have a thickness of 50 Å between the first common layer 131 and the second common layer 133 on the bank 120.

Figure 10:
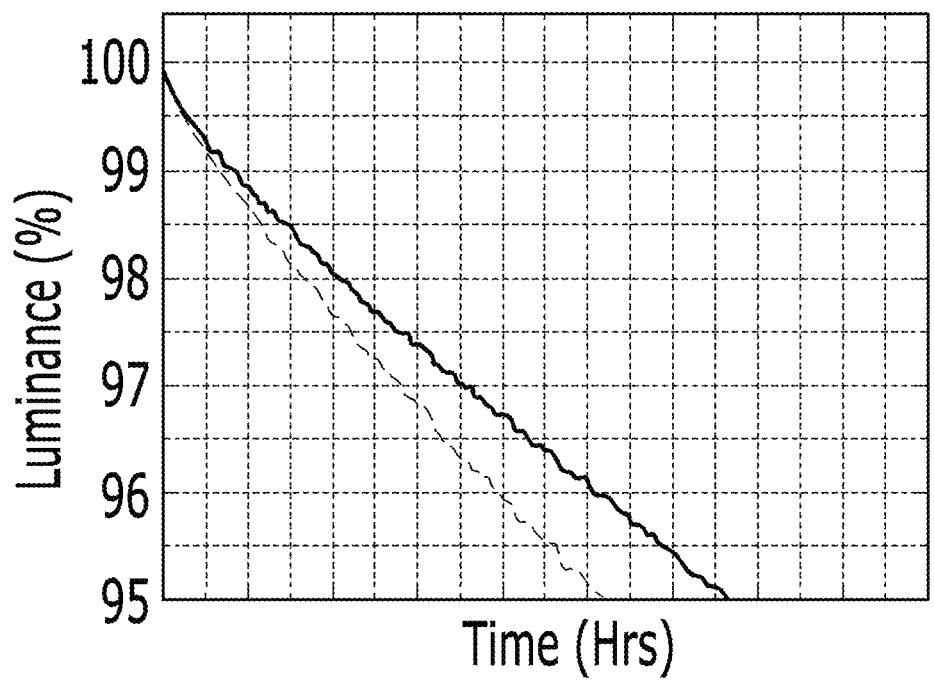
FIG. 10 is a graph illustrating the lifespan characteristics of the present invention and a comparative example.

FIG. 10 is a graph illustrating the lifespan characteristics of the present invention and the comparative example.

In FIG. 10, the dotted line indicates the lifespan of the comparative example and the solid line indicates the lifespan of the example of the present invention. As illustrated in FIG. 10, comparing the lifespans of the example of the present invention and the comparative example based on the time taken until the initial brightness is reduced to 95% thereof, it can be found that the lifespan of the example of the present invention is increased by approximately 30% or more compared to that of the comparative example. Since the organic light-emitting display panel is substantially used until the brightness thereof is reduced below the aforementioned value, a further increase in the lifespan may be attained in practice.

In addition, when a particular sub-pixel is turned on, there occurs no current leakage to an adjacent sub-pixel, which may increase the luminous efficacy of the sub-pixel to be turned on. In the example of the present invention, the luminous efficacy was increased by approximately 102% compared to the comparative example.

Figure 11:
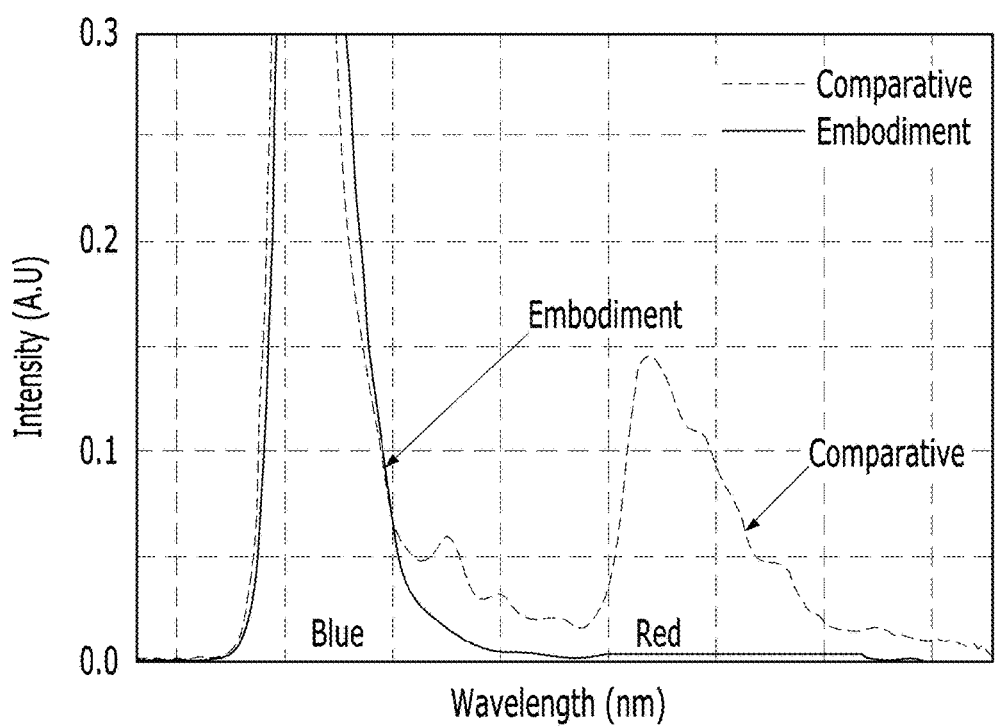
FIG. 11 is a graph illustrating the relationship between intensity and wavelength during low-gradation blue illumination of the organic light-emitting display panel of the present invention.

FIG. 11 is a graph illustrating the relationship between intensity and wavelength during low-gradation blue illumination of the organic light-emitting display panel of the present invention.

As illustrated in FIG. 11, it can be appreciated in the organic light-emitting display panel of the present invention that no light is emitted from a red sub-pixel adjacent to a blue sub-pixel upon low-gradation blue illumination and an impulse is observed only at a blue wavelength, which enables a display having highly pure chromaticity without color mixing when a sub-pixel of a particular color is driven. This means that other sub-pixels do not emit light when a particular sub-pixel (a blue sub-pixel in the experimental example) is turned on, and that no lateral current leakage occurs.

Figure 12A:
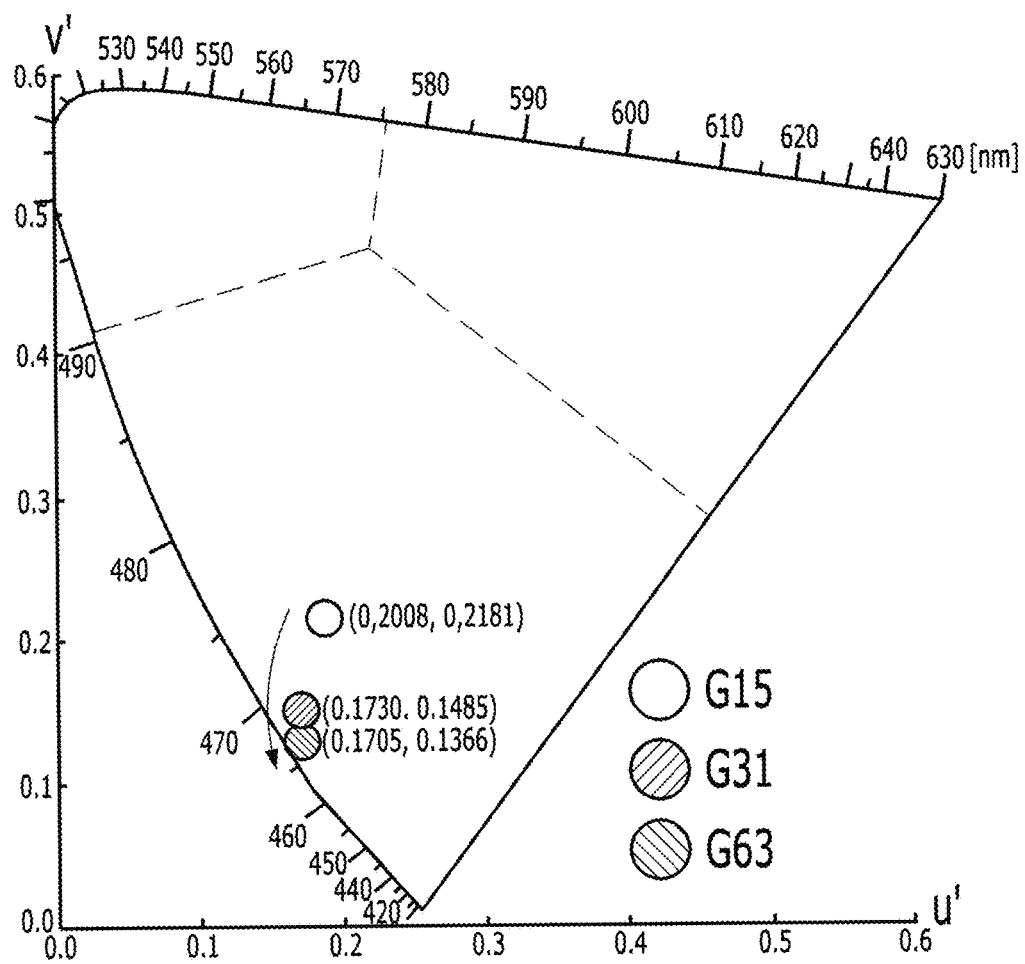
FIGS. 12A and 12B are views illustrating variation in blue gradation in the organic light-emitting display panels according to a comparative example and an example of the present invention using color coordinates.
Figure 12B:
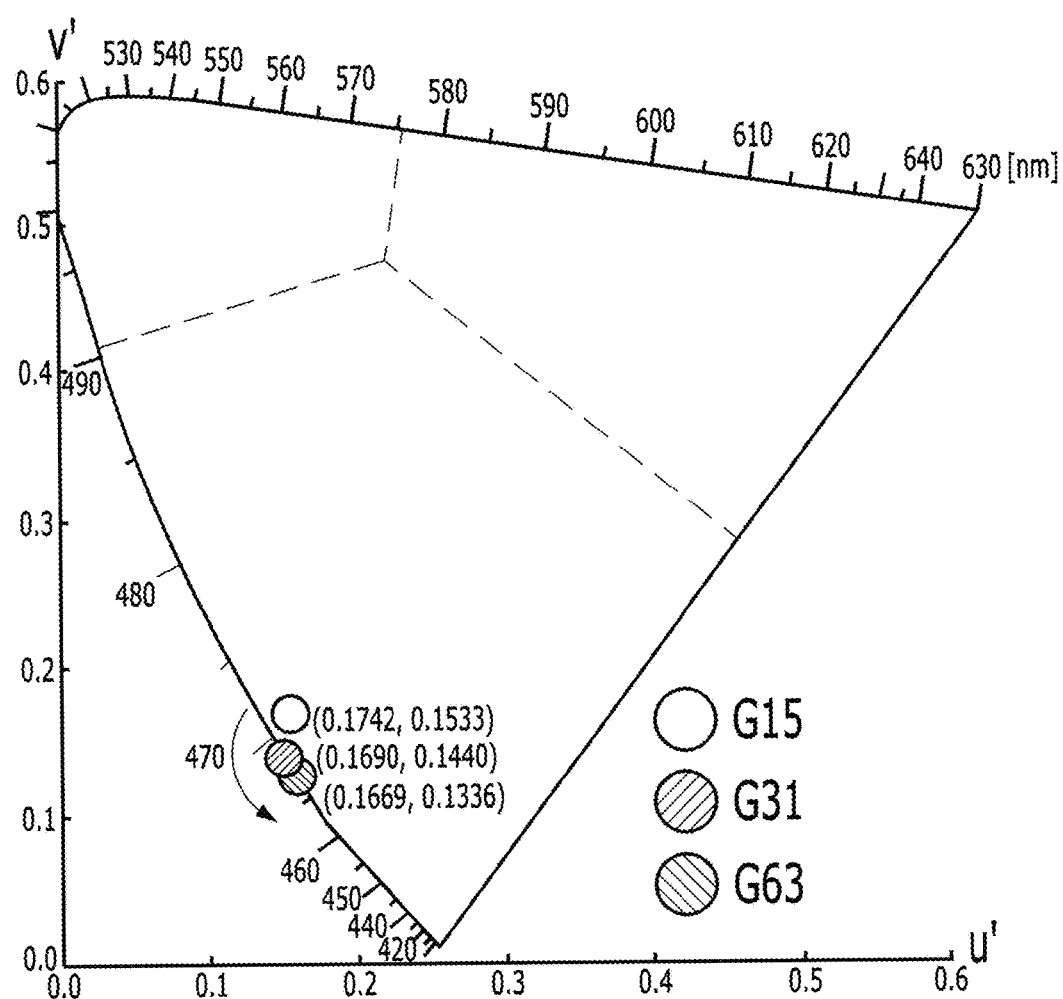

FIGS. 12A and 12B are views illustrating variation in blue gradation in organic light-emitting display panels according to a comparative example and an example of the present invention using color coordinates.

FIG. 12A illustrates the color coordinates when the grayscale of blue is G15, G31 and G63 in the organic light-emitting display panel of the comparative example. A higher grayscale number means a stronger gradation. It is observed that the color coordinates appear at the position closer to a red range at the grayscale of G15, which corresponds to a low gradation in the same blue series. Thereby, it is observed that the color coordinates of the medium gradation of G31 and the color coordinates of the high gradation of G63 are at similar positions, whereas the color coordinates of low gradation of G15 are shifted close to a red range.

On the other hand, as illustrated in FIG. 12B, it can be confirmed that the color coordinates of low, medium, and high gradations of G15, G31 and G63 of blue light are at adjacent positions, and mixing of a particular color does not occur upon low-gradation display.

As described above, in the organic light-emitting display panel of the present invention, current leakage between adjacent sub-pixels, which occurs in the structure using a common layer, may be prevented at the position of an auxiliary pattern, which is formed at a particular position of a stack using a different transport property from that of an adjacent layer. Thereby, vivid gradation display is possible without current leakage from a particular sub-pixel that is driven to an adjacent sub-pixel, which may increase luminous efficacy and lifespan of the organic light-emitting display panel.

Meanwhile, although not described above, an organic light-emitting diode of each sub-pixel, which includes first and second electrodes and an organic layer therebetween, or the first electrode or the second electrode is connected to a driving thin-film transistor for each sub-pixel. The driving thin-film transistor may be formed on the substrate below the organic light-emitting diode, and in the same process, a switching thin-film transistor, a sensing thin-film transistor, and a storage capacitor, which are connected to the driving thin-film transistor for each sub-pixel, may be further formed.

In addition, after the second electrode is formed, a capping layer may be further formed to cover the respective sub-pixels, and a thin-film encapsulation in which an inorganic layer and an organic layer are alternately stacked one above another may be further provided thereon. The thin-film transistor and the thin-film encapsulation may have generally known structures, and a description thereof is omitted in this specification.

As is apparent from the above description, an organic light-emitting display panel of the present invention has the following effects.

First, by providing an auxiliary pattern, which has high conductivity, in contact with a common layer, lateral current leakage at the auxiliary pattern may be prevented. In this case, the transfer of current to the upper side of the highly conductive common layer of a sub-pixel adjacent to a sub-pixel that is turned on may be prevented, which may prevent the effect of lateral current leakage to the adjacent sub-pixel that is not turned on.

Secondly, with the prevention of lateral current leakage, unintended emission of light from a sub-pixel adjacent to a sub-pixel that is turned on may be prevented during low-gradation driving, thereby preventing color mixing at a low gradation. Accordingly, upon image display, color purity may be increased.

Thirdly, it is not necessary to increase a drive voltage in order to prevent color mixing owing to increased color purity at a low gradation, which may increase the luminous efficacy and lifespan of the organic light-emitting display panel.

An organic light-emitting display panel according to various embodiments comprises: a substrate including a plurality of sub-pixels, each sub-pixel comprising: an emission portion, a non-emission portion, and a first electrode disposed in at least the emission portion; a bank disposed in the non-emission portions of at least two adjacent sub-pixels and overlapping an edge of the first electrodes of the at least two adjacent sub-pixels; a first common layer disposed on the first electrodes in the emission portions of the at least two adjacent sub-pixels and on the bank in the non-emission portions of the at least two adjacent sub-pixels, the first common layer having a hole transport property; an auxiliary pattern disposed on the first common layer, between the emission portions of the at least two adjacent sub-pixels and in contact with the first common layer, the auxiliary pattern having an electron transport property; a second common layer disposed on the auxiliary pattern and the first common layer, the second common layer having a hole transport property; and each of the at least two adjacent sub-pixels further comprising a light-emitting layer disposed on the second common layer.

In one or more embodiments, the auxiliary pattern is formed of an electron transport material.

In one or more embodiments, the auxiliary pattern has a highest occupied molecular orbital (HOMO) energy level that is lower than a HOMO energy level of the first common layer by a value within a range from 0.4 eV to 0.8 eV.

In one or more embodiments, the second common layer includes a hole transport material, and the second common layer has a lowest unoccupied molecular orbital (LUMO) energy level and a HOMO energy level that are respectively higher than a LUMO energy level and the HOMO energy level of the auxiliary pattern.

In one or more embodiments, the second common layer includes a plurality of layers formed of different hole transport materials respectively.

In one or more embodiments, the first common layer includes a hole injection material as a host and a p-type dopant.

In one or more embodiments, the auxiliary pattern is provided in a stripe along the sub-pixels in a column.

In one or more embodiments, the auxiliary pattern is configured to receive a voltage applied on opposite ends thereof.

In one or more embodiments, the auxiliary pattern is provided in an island form in a single sub-pixel or a plurality of sub-pixels.

In one or more embodiments, the plurality of sub-pixels include a red sub-pixel, a green sub-pixel, and a blue sub-pixel, the light-emitting layer provided in the red sub-pixel is a red light-emitting layer, the light-emitting layer provided in the green sub-pixel is a green light-emitting layer, and the light-emitting layer provided in the blue sub-pixel is a blue light-emitting layer, wherein the auxiliary pattern is provided only around the emission portion of the red sub-pixel.

In one or more embodiments, the blue light-emitting layer is in contact with the second common layer.

In one or more embodiments, the red sub-pixel further comprises a first auxiliary hole transport layer between the second common layer and the red light-emitting layer.

In one or more embodiments, the green sub-pixel further comprises a second auxiliary hole transport layer between the second common layer and the green light-emitting layer, wherein the first auxiliary hole transport layer is thicker than the second auxiliary hole transport layer.

In one or more embodiments, the organic light-emitting display panel further comprises: a third common layer and a second electrode covering the red light-emitting layer, the green light-emitting layer, and the blue light-emitting layer; and, an electron injection layer between the second electrode and the third common layer.

In one or more embodiments, the auxiliary pattern and the third common layer are formed of an electron transport material.

In one or more embodiments, the plurality of sub-pixels include a red sub-pixel, a green sub-pixel, and a blue sub-pixel, wherein the light-emitting layer of each sub-pixel is a white light-emitting layer, and wherein a red color filter layer is provided in the red sub-pixel, a green color filter layer is provided in the green sub-pixel, and a blue color-filter layer is provided in the blue sub-pixel, wherein the white light-emitting layer is a common layer covering the second common layer.

Although the embodiments of the present invention have been described above in detail with reference to the accompanying drawings, it will be apparent to those skilled in the art that the present invention described above is not limited to the embodiments described above, and various substitutions, modifications, and alterations may be devised within the spirit and scope of the present invention. Accordingly, various embodiments disclosed in the present invention are not intended to limit the technical sprit of the present invention, and the scope of the technical sprit of the present invention is not limited by the embodiments. Accordingly, the disclosed embodiments are provided for the purpose of description and are not intended to limit the technical scope of the disclosure, and the technical scope of the disclosure is not limited by the embodiments. The range of the disclosure should be interpreted based on the following claims, and all technical ideas that fall within the range equivalent to the claims should be understood as belonging to the scope of the disclosure.

What is claimed is:

1. An organic light-emitting display panel, comprising:
    a substrate including a plurality of sub-pixels each having an emission portion and a non-emission portion;
    a first electrode to cover at least the emission portion of each sub-pixel;
    a bank in the non-emission portion to overlap an edge of the first electrode;
    a first common layer on the first electrode in the emission portion and the bank in the non-emission portion;
    an auxiliary pattern in contact with the first common layer on the bank;
    a second common layer on the auxiliary pattern and the first common layer; and
    a light-emitting layer on the second common layer in each sub-pixel.

2. The panel according to claim 1, wherein the auxiliary pattern includes an electron transport material.

3. The panel according to claim 2, wherein the auxiliary pattern has a HOMO energy level that is lower than a highest occupied molecular orbital (HOMO) energy level of the first common layer by a value within a range from 0.4 eV to 0.8 eV.

4. The panel according to claim 2, wherein the second common layer includes a hole transport material, and the second common layer has a lowest unoccupied molecular orbital (LUMO) energy level and a HOMO energy level that are respectively higher than a LUMO energy level and the HOMO energy level of the auxiliary pattern.

5. The panel according to claim 1, wherein the second common layer includes a plurality of layers formed of different hole transport materials respectively.

6. The panel according to claim 1, wherein the first common layer includes a hole injection material as a host and a p-type dopant.

7. The panel according to claim 1, wherein the auxiliary pattern is provided in a stripe along the sub-pixels in a column.

8. The panel according to claim 7, wherein the auxiliary pattern receives a voltage applied on opposite ends thereof.

9. The panel according to claim 1, wherein the auxiliary pattern is provided in an island form in a single sub-pixel or a plurality of sub-pixels.

10. The panel according to claim 1, wherein the sub-pixels of the substrate include a red sub-pixel, a green sub-pixel, and a blue sub-pixel,
    wherein the light-emitting layer provided in the red sub-pixel is a red light-emitting layer,
    wherein the light-emitting layer provided in the green sub-pixel is a green light-emitting layer, and
    wherein the light-emitting layer provided in the blue sub-pixel is a blue light-emitting layer.

11. The panel according to claim 10, wherein the auxiliary pattern is provided only at a boundary of the emission portions of the blue sub-pixel and the red sub-pixel.

12. The panel according to claim 10, wherein the blue light-emitting layer is in contact with the second common layer.

13. The panel according to claim 10, further comprising a first auxiliary hole transport layer between the second common layer and the red light-emitting layer in the red sub-pixel.

14. The panel according to claim 13, further comprising a second auxiliary hole transport layer between the second common layer and the green light-emitting layer in the green sub-pixel.

15. The panel according to claim 14, wherein the first auxiliary hole transport layer is thicker than the second auxiliary hole transport layer.

16. The panel according to claim 10, further comprising a third common layer and a second electrode to cover the red light-emitting layer, the green light-emitting layer, and the blue light-emitting layer.

17. The panel according to claim 16, wherein the auxiliary pattern and the third common layer are formed of an electron transport material.

18. The panel according to claim 16, further comprising an electron injection layer between the second electrode and the third common layer.

19. The panel according to claim 1, wherein the sub-pixels of the substrate include a red sub-pixel, a green sub-pixel, and a blue sub-pixel,
    wherein the light-emitting layer of each sub-pixel is a white light-emitting layer, and
    wherein a red color filter layer in the red sub-pixel, a green color filter layer in the green sub-pixel, and a blue color-filter layer in the blue sub-pixel are further provided.

* * * * *